United States Patent
Matsuura et al.

(10) Patent No.: US 12,068,139 B2
(45) Date of Patent: Aug. 20, 2024

(54) PLASMA PROCESSING APPARATUS

(71) Applicant: TOKYO ELECTRON LIMITED, Tokyo (JP)

(72) Inventors: Shin Matsuura, Miyagi (JP); Jun Hirose, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 637 days.

(21) Appl. No.: 15/692,357

(22) Filed: Aug. 31, 2017

(65) Prior Publication Data

US 2018/0061619 A1  Mar. 1, 2018

(30) Foreign Application Priority Data

Sep. 1, 2016 (JP) .................................. 2016-171244

(51) Int. Cl.
*H01J 37/32* (2006.01)
*C23C 16/455* (2006.01)
*C23C 16/458* (2006.01)
*H01L 21/67* (2006.01)

(52) U.S. Cl.
CPC .. *H01J 37/32577* (2013.01); *C23C 16/45517* (2013.01); *C23C 16/4585* (2013.01); *H01J 37/32174* (2013.01); *H01J 37/32513* (2013.01); *H01J 37/32633* (2013.01); *H01J 37/32651* (2013.01); *H01J 37/32009* (2013.01);

(Continued)

(58) Field of Classification Search
CPC ................ H01J 37/32; H01J 37/32009; H01J 37/32082; H01J 37/32091; H01J 37/32174; H01J 37/32431; H01J 37/32458; H01J 37/32513; H01J 37/32577; H01J 37/32633; H01J 37/32651; H01J 37/32743; H01L 21/67069; H01L 21/67126; H01L 21/6719; H01L 21/67196; H01L 21/67201; H01L 21/67739; H01L 21/67772; C23C 14/0068; C23C 16/45517; C23C 16/4585
See application file for complete search history.

(56) References Cited

U.S. PATENT DOCUMENTS 3,569,649 A * 3/1971 Spielbauer ............... H01H 1/20
                                                        200/83 B
3,674,368 A * 7/1972 Johannsmeier ..... G03F 7/70691
                                                        355/78

(Continued)

FOREIGN PATENT DOCUMENTS

JP     2015-126197 A    7/2015

*Primary Examiner* — Kurt Sweely
(74) *Attorney, Agent, or Firm* — XSENSUS LLP

(57) ABSTRACT

A plasma processing apparatus of the present disclosure includes a chamber, a shutter, and a contact portion. The chamber has an opening in a sidewall thereof so as to carry a wafer W into the chamber through the opening, and performs therein a predetermined processing on the wafer W by plasma of a processing gas supplied thereinto. The shutter opens or closes the opening by moving along the sidewall of the chamber. The contact portion is formed of a conductive material, and is not in contact with the shutter while the shutter is moving. When the shutter is in the position for closing the opening, the contact portion is displaced in a direction different from the direction of movement of the shutter to come into contact with the shutter.

12 Claims, 9 Drawing Sheets

(52) U.S. Cl.
CPC ... *H01J 37/32091* (2013.01); *H01J 37/32743* (2013.01); *H01L 21/67069* (2013.01)

(56) References Cited

U.S. PATENT DOCUMENTS

| | | | | |
|---|---|---|---|---|
| 5,226,632 | A * | 7/1993 | Tepman | F16K 1/10 137/315.27 |
| 6,221,221 | B1 * | 4/2001 | Al-Shaikh | H01J 37/32577 204/298.31 |
| 6,779,481 | B2 * | 8/2004 | Kent | H01J 37/32431 156/345.43 |
| 7,393,432 | B2 * | 7/2008 | Dhindsa | H01J 37/32174 156/345.44 |
| 7,534,301 | B2 * | 5/2009 | White | H01J 37/32174 118/728 |
| 7,789,963 | B2 * | 9/2010 | Mitrovic | H01L 21/67069 118/729 |
| 8,597,462 | B2 * | 12/2013 | Brown | B23K 20/122 118/725 |
| 9,184,072 | B2 * | 11/2015 | Devine | H01L 21/67069 |
| 2004/0149214 | A1 * | 8/2004 | Hirose | H01J 37/32458 118/715 |
| 2005/0014368 | A1 * | 1/2005 | Yoshioka | C25D 17/06 438/689 |
| 2006/0060302 | A1 * | 3/2006 | White | H01J 37/32082 156/345.28 |
| 2007/0158027 | A1 * | 7/2007 | Aoki | H01J 37/32623 156/345.43 |
| 2009/0301656 | A1 * | 12/2009 | Nishimoto | H01J 37/32192 156/345.41 |
| 2011/0209985 | A1 * | 9/2011 | Li | C23C 14/541 204/192.12 |
| 2011/0287632 | A1 * | 11/2011 | Brown | B23K 20/122 438/716 |
| 2014/0345802 | A1 * | 11/2014 | Umehara | H01J 37/32458 156/345.28 |
| 2016/0013025 | A1 * | 1/2016 | Nagorny | H01J 37/32513 118/50.1 |
| 2016/0240426 | A1 * | 8/2016 | Kamath | H01J 37/32724 |

* cited by examiner

FIG. 15A    FIG. 15B

PLASMA PROCESSING APPARATUS

CROSS-REFERENCE TO RELATED APPLICATIONS

This application is based on and claims priority from Japanese Patent Application No. 2016-171244, filed on Sep. 1, 2016, with the Japan Patent Office, the disclosure of which is incorporated herein in its entirety by reference.

TECHNICAL FIELD

Various aspects and exemplary embodiments of the present disclosure relate to a plasma processing apparatus.

BACKGROUND

In a semiconductor manufacturing apparatus, there is known a plasma processing apparatus that performs a processing using plasma. In such a plasma processing apparatus, a processing target substrate to be processed is carried into a chamber, and a predetermined processing gas and high-frequency power are applied into the chamber, so that plasma of the processing gas is generated in the chamber.

The processing target substrate is carried into the chamber from a carry-in port provided in the sidewall of the chamber. The sidewall portion of the chamber, in which the carry-in port is provided, is closed from the outside by a gate valve, but is in communication with a processing space, in which plasma is generated, within the chamber. Therefore, plasma generated in the chamber spreads to the space in the vicinity of the carry-in port, which may cause deterioration in the uniformity of plasma. Thereby, the uniformity in a processing may be deteriorated on the processing target substrate.

In order to avoid this, the carry-in port formed in the sidewall of the chamber is closed by a shutter with respect to the inside of the chamber. During the carry-in and carry-out of the processing target substrate, the shutter moves to open the carry-in port in the sidewall of the chamber. See, e.g., Japanese Patent Laid-Open Publication No. 2015-126197.

SUMMARY

One aspect of the present disclosure is a plasma processing apparatus including a chamber, a shutter, and a contact portion. The chamber has an opening in the sidewall thereof for the carry-in of a processing target substrate, and performs a predetermined processing on the processing target substrate by plasma of a processing gas supplied thereinto. The shutter moves along the sidewall of the chamber, thereby opening or closing the opening. The contact portion is formed of a conductive material, and is not in contact with the shutter when the shutter is moving, but is displaced in a direction, which is different from the direction of movement of the shutter, thereby being brought into contact with the shutter when the shutter is in the position for closing the opening.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 15A and 15B are views for explaining an exemplary first connection unit according to Example 6.

DETAILED DESCRIPTION

Figure 1:
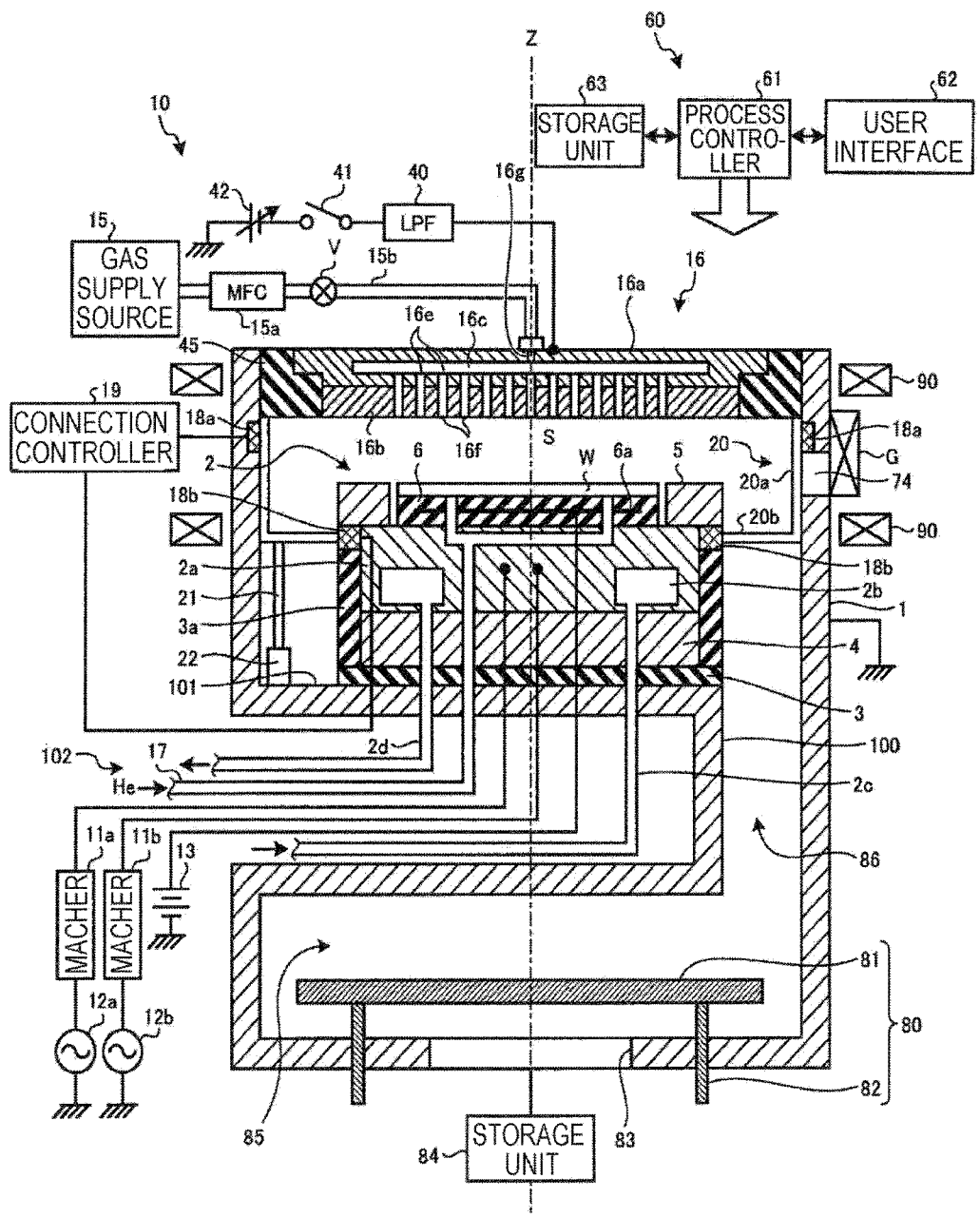
FIG. 1 is a cross-sectional view illustrating an exemplary configuration of a plasma processing apparatus.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

Within the chamber, for example, the sidewall of the chamber or the shutter is required to be connected to a ground potential as a high-frequency return path. In a conventional plasma processing apparatus, the entire chamber is grounded, and when moving the shutter so as to close the carry-in port in the sidewall of the chamber, a spiral (a conductive seal member provided in the direction of movement of the shutter) is crushed by the shutter so as to ensure positive conduction between the shutter and the sidewall of the chamber.

However, when the spiral is crushed by the shutter, the movement of the shutter and the pressing of the shutter against the spiral are performed by a drive mechanism that drives the shutter. Therefore, there was a demand for a drive mechanism capable of generating a large drive force, and the drive mechanism was getting bigger. In addition, since such a drive mechanism is provided in the plasma processing apparatus, it is difficult to reduce the size of the plasma processing apparatus.

A plasma processing apparatus disclosed herein includes a chamber, a shutter, and a contact portion. The chamber has an opening in a sidewall thereof so as to carry—a processing target substrate into the chamber through the opening, and performs therein a predetermined processing on the processing target substrate by plasma of a processing gas supplied thereinto. The shutter opens or closes the opening by moving along the sidewall of the chamber. The contact portion is formed of a conductive material. The contact portion is in non-contact with the shutter while the shutter moves, and is displaced in a direction different from a moving direction of the shutter to come into contact with the shutter when the shutter is in a position for closing the opening.

In addition, in an exemplary embodiment of the plasma processing apparatus disclosed here, the contact portion may be a portion of a leaf spring formed of a conductive material. In addition, the plasma processing apparatus may further include an elastic tube and a controller configured to increase a pressure of a fluid filled in the tube so as to expand the tube when the shutter is in the position for closing the opening in the chamber so that the contact portion is brought into contact with the shutter by the expanded tube.

In addition, in an exemplary embodiment of the plasma processing apparatus disclosed here, the contact portion may be an annular tube having elasticity and conductivity. In addition, the plasma processing apparatus may include a controller configured to control a pressure of a fluid filled in the tube. In addition, the shutter may be disposed inside a rim of the annular tube. In addition, the controller may reduce the pressure of the fluid filled in the tube so as to reduce a diameter of the rim formed by the tube when the shutter is in the position for closing the opening of the chamber such that the tube and the shutter are brought into contact with each other.

In addition, in an exemplary embodiment of the plasma processing apparatus disclosed here, the contact portion may be an annular tube having elasticity and conductivity. In addition, the plasma processing apparatus may include a controller configured to control a pressure of a fluid filled in the tube. In addition, the shutter may be disposed outside a rim of the annular tube. In addition, the controller may by increase the pressure of the fluid filled in the tube so as to increase a diameter of the rim formed by the tube when the shutter is in the position for closing the opening such that the tube and the shutter are brought into contact with each other.

In addition, in an exemplary embodiment of the plasma processing apparatus disclosed here, the plasma processing apparatus may further include a moving mechanism configured to displace the contact portion to a position to come into contact with the shutter by rotating a cam when the shutter is in the position for closing the opening, and to displace the contact portion to a position spaced apart from the shutter by rotating the cam when the shutter is not in the position for closing the opening.

In addition, in an exemplary embodiment of the plasma processing apparatus disclosed here, the plasma processing apparatus may further include a holding portion configured to hold the contact portion, and a controller configured to control a temperature of the holding portion so as to thermally expand the holding portion, thereby displacing the contact portion.

In addition, in an exemplary embodiment of the plasma processing apparatus disclosed herein, the plasma processing apparatus may further include a first holding portion configured to hold the contact portion, a first electromagnet provided in the first holding portion, a second holding portion configured to hold the first holding portion, a second electromagnet provided in the second holding portion at a position opposite the first electromagnet, and a controller configured to control a polarity of the first electromagnet and the second electromagnet so as to displace the contact portion.

In addition, in an exemplary embodiment of the plasma processing apparatus disclosed here, the chamber may have a cylindrical sidewall, the shutter may have a cylindrical sidewall, and the shutter may be disposed in the chamber such that a center axis thereof overlaps a center axis of the chamber.

According to various aspects and exemplary embodiments of the present disclosure, it is possible to miniaturize a plasma processing apparatus.

Hereinafter, an exemplary embodiment of a plasma processing apparatus disclosed here will be described in detail with reference to the accompanying drawings. In addition, the plasma processing apparatus disclosed here is not limited by the present exemplary embodiment.

EXAMPLE 1

[Configuration of Plasma Processing Apparatus 10]

Figure 2:
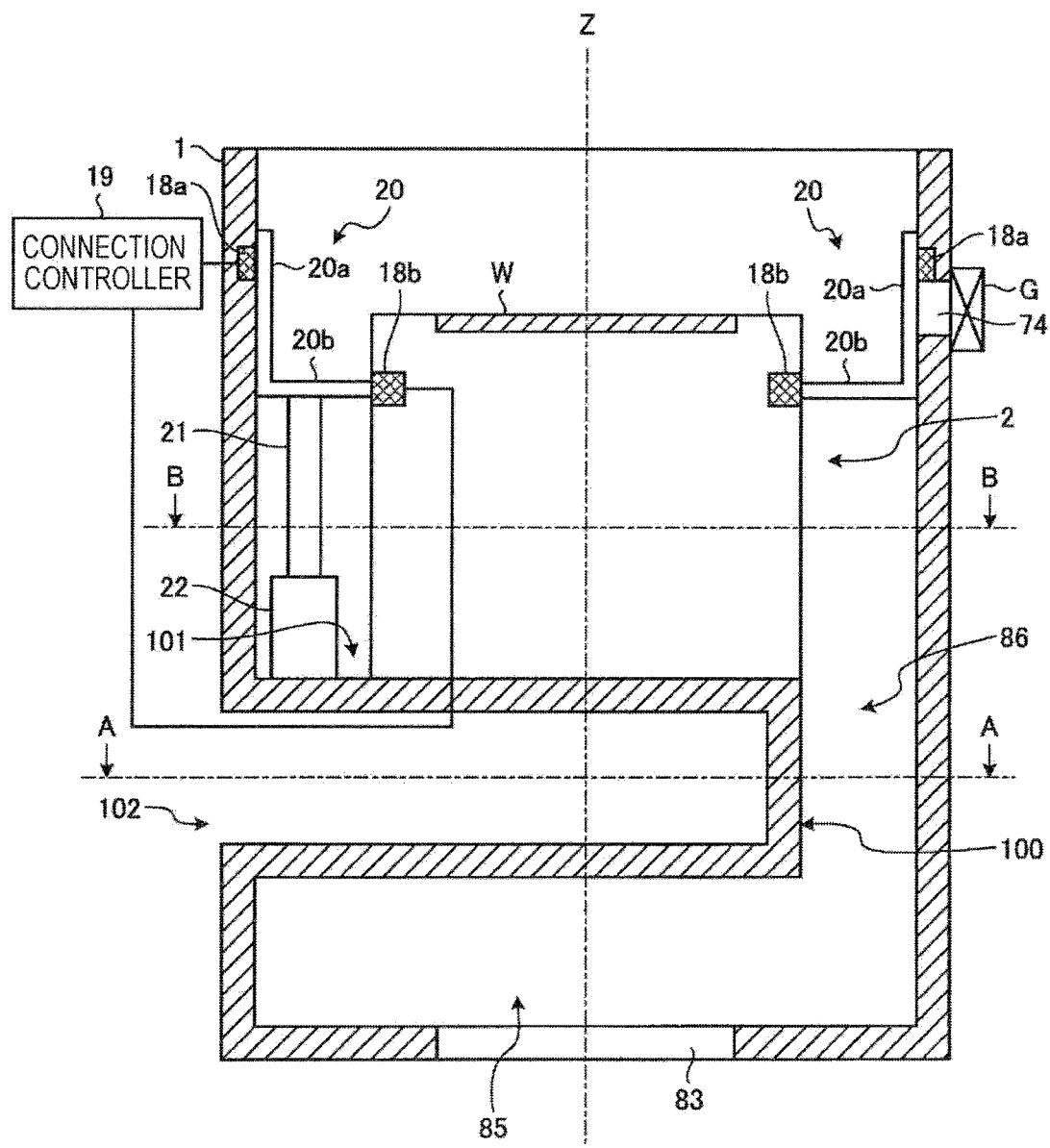
FIG. 2 is a cross-sectional view schematically illustrating an exemplary positional relationship between a chamber and a shutter.
Figure 3:
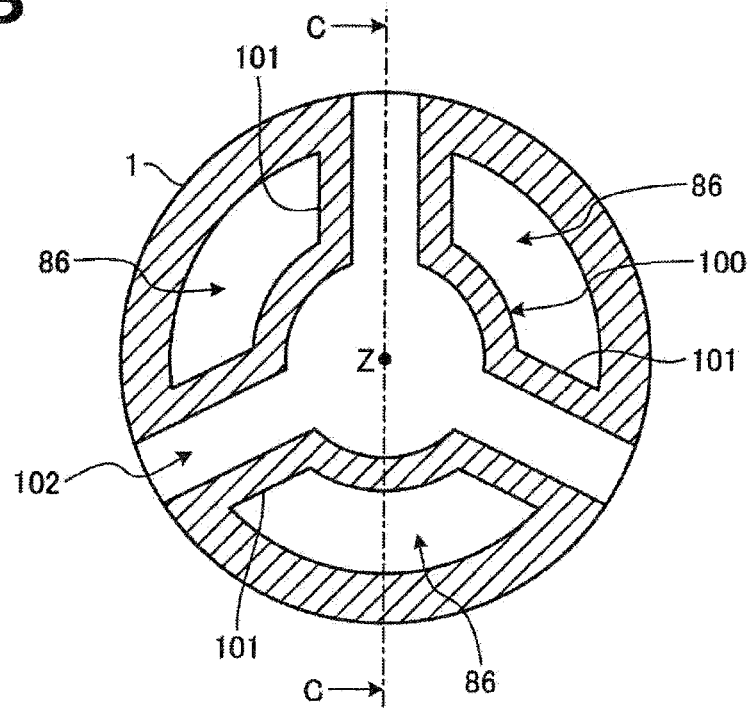
FIG. 3 is a view schematically illustrating an exemplary cross section of the chamber, which is taken in the direction indicated by arrows A-A in FIG. 2.
Figure 4:
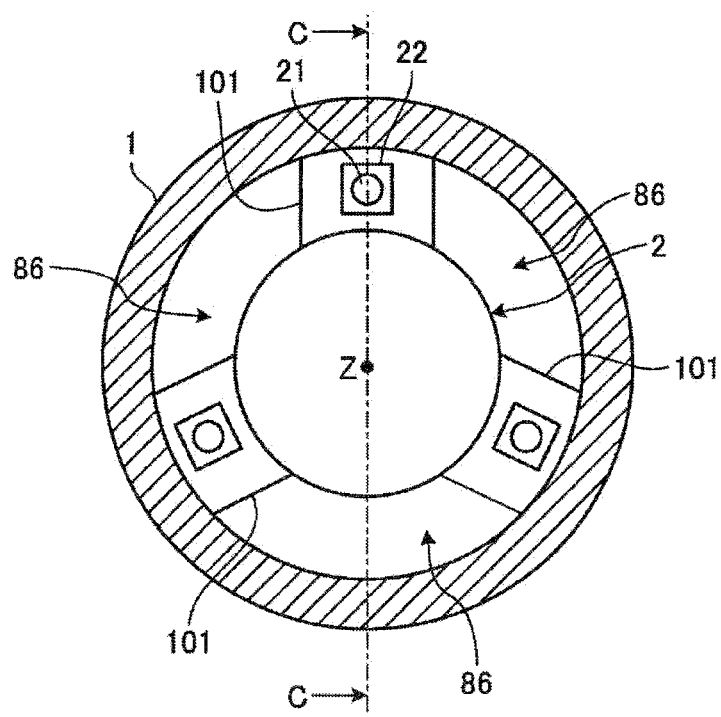
FIG. 4 is a view schematically illustrating an exemplary cross section of the chamber, which is taken in the direction indicated by arrows B-B in FIG. 2.

FIG. 1 is a cross-sectional view illustrating an exemplary configuration of a plasma processing apparatus 10. FIG. 2 is a cross-sectional view schematically illustrating an exemplary positional relationship between a chamber 1 and a shutter 20. FIG. 3 is a view schematically illustrating an exemplary cross section of the chamber 1, which is taken in the direction indicated by arrows A-A in FIG. 2. FIG. 4 is a view schematically illustrating an exemplary cross section of the chamber 1, which is taken in the direction indicated by arrows B-B in FIG. 2. A cross-section of the chamber 1, which is taken in the direction indicated by arrows C-C in FIGS. 3 and 4, corresponds to the cross section illustrated in FIG. 2.

The plasma processing apparatus 10 is, for example, a capacitively coupled parallel flat plate plasma etching apparatus. The plasma processing apparatus 10 is formed of, for example, aluminum, the surface of which is anodized, and includes the chamber 1 in which a substantially cylindrical space is formed. The chamber 1 is a grounded for safety. In FIGS. 1 to 4, the center axis of the substantially cylindrical space formed by the inner wall of the chamber 1 is defined as the Z-axis.

A substantially cylindrical exhaust port 83 is formed in the bottom portion of the chamber 1. A pedestal 100 is provided above the exhaust port 83 to support a placing table 2 from below. The pedestal 100 is supported by a plurality of support beams 101, which extend from the inner wall of the chamber 1 in a direction approaching the Z-axis. In the present example, each support beam 101 extends from the inner wall of the chamber 1 toward the Z-axis in a direction, which is orthogonal to the Z-axis. In the present example, for example, as illustrated in FIGS. 3 and 4, three support beams 101 are provided in the plasma processing apparatus 10, and these support beams 101 are arranged, for example, axially symmetrically with respect to the Z-axis. That is, a line passing through the center of the arrangement of three support beams 101 coincides with the Z-axis, and two adjacent support beams 101 have an angle of 120 degrees about the Z-axis. In the present example, the pedestal 100 and the respective support beams 101 are formed of the same material as the chamber 1.

In the present example, the placing table 2 has a substantially cylindrical shape and is disposed in the chamber 1 such that the center axis of the outer wall of the placing table 2 coincides with the Z axis. The placing table 2 includes a lower electrode 2a, a base 4, a focus ring 5, and an electrostatic chuck 6. The base 4 is formed in a substantially cylindrical shape by, for example, ceramics and is disposed on the pedestal 100 via an insulating plate 3. The lower electrode 2a, which is formed of, for example, aluminum, is provided on the base 4.

The electrostatic chuck 6 is provided on the upper surface of the lower electrode 2a to electrostatically attract and hold a wafer W, which is an exemplary processing target substrate. The electrostatic chuck 6 has a structure in which an electrode 6a, which is formed of a conductive film, is sandwiched between a pair of insulating layers or insulating sheets. A direct current (DC) power supply 13 is electrically connected to the electrode 6a. The wafer W is placed on the upper surface of the electrostatic chuck 6 and attracted by and held on the upper surface of the electrostatic chuck 6 by an electrostatic force, which is generated in the electrostatic chuck 6 by a DC voltage supplied from the DC power supply 13. The wafer W has a substantially circular shape. The wafer W is disposed on the upper surface of the electrostatic chuck 6 so that the center axis of the wafer W coincides with the Z-axis illustrated in FIG. 1.

The conductive focus ring 5, which is formed of, for example, single crystal silicon, is provided on the upper surface of the lower electrode 2a so as to surround the electrostatic chuck 6. The uniformity of a plasma processing such as, for example, etching on the surface of the wafer W is improved by the focus ring 5. The side surfaces of the lower electrode 2a and the base 4 are surrounded by a cylindrical inner wall member 3a, which is formed of, for example, quartz.

Within the lower electrode 2a, for example, an annular coolant chamber 2b is formed. A coolant having a predetermined temperature such as, for example, cooling water is circulated and supplied from a chiller unit (not illustrated) provided outside the coolant chamber 2b through pipes 2c and 2d. The temperature of the lower electrode 2a, the base 4, and the electrostatic chuck 6 is controlled by the coolant circulating in the coolant chamber 2b such that the temperature of the wafer W on the electrostatic chuck 6 is controlled to a predetermined temperature.

In addition, a heat transfer gas such as, for example, He gas, is supplied from a heat transfer gas supply mechanism (not illustrated) into a gap between the upper surface of the electrostatic chuck 6 and the back surface of the wafer W through a pipe 17.

A high-frequency power source 12a is connected to the lower electrode 2a via a matcher 11a. In addition, a high-frequency power source 12b is connected to the lower electrode 2a via a matcher 11b. The high-frequency power source 12a supplies high-frequency power having a predetermined frequency (e.g., 100 MHz), which is used for plasma generation, to the lower electrode 2a. In addition, the high-frequency power source 12b supplies high-frequency power having a predetermined frequency (e.g., 13 MHz), which is used for the attraction (bias) of ions and is lower than that of the high-frequency power supplied by the high-frequency power source 12a, to the lower electrode 2a.

Around the placing table 2, for example, as illustrated in FIGS. 1 to 4, an exhaust path 86 is provided so as to surround the placing table 2. The exhaust path 86 is in communication with an exhaust chamber 85, which is formed below the pedestal 100, in the space between adjacent support beams 101. In the present example, the exhaust path 86, which is formed around the placing table 2, is formed axially symmetrically with respect to the Z-axis between two adjacent support beams 101. Therefore, the flow of a gas, which is supplied from an upper electrode 16 and exhausted from the exhaust port 83, is axially symmetrical with respect to the Z-axis that passes through the center of the wafer W disposed on the placing table 2.

Figure 5:
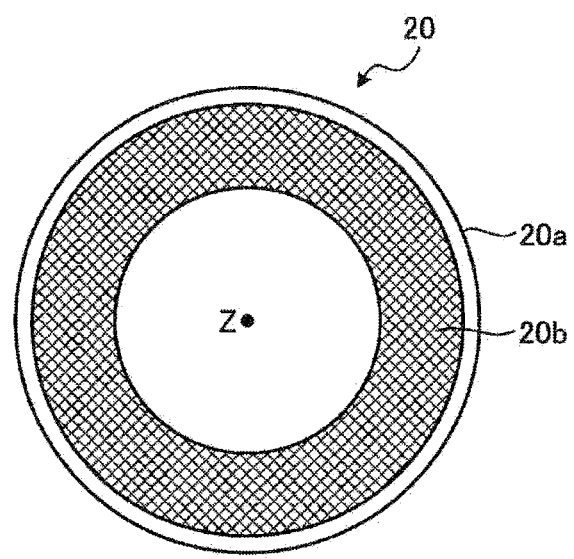
FIG. 5 is a plan view illustrating an exemplary shutter.

The substantially cylindrical shutter 20 is provided in the exhaust path 86 so as to surround the placing table 2. The shutter 20 is formed of a conductive material such as, for example, aluminum, and for example, as illustrated in FIG. 5, includes a wall portion 20a extending in the Z-axis direction and a bottom portion 20b extending in the direction approaching the Z-axis. FIG. 5 is a plan view illustrating an example of the shutter 20. A plurality of through-holes is formed in the bottom portion 20b, and the bottom portion 20b also functions as a baffle plate.

A shaft 21 is connected to the lower surface of the shutter 20. The shaft 21 is also connected to a drive unit 22, which is provided on the support beam 101. The drive unit 22 vertically moves the shutter 20 by moving the shaft 21 in the vertical direction, i.e. in the Z-axis direction. In the present example, for example, as illustrated in FIG. 4, the chamber 1 is provided with three support beams 101, and the drive unit 22 is provided on each support beam 101. Accordingly, the shutter 20 is vertically moved by three drive units 22. In addition, the shutter 20 may be driven by four or more drive units. In addition, the drive unit 22 may not be necessarily provided on the support beam 101, and may be fixedly provided on the inner wall of the chamber 1.

The sidewall of the chamber 1 above the electrostatic chuck 6 is provided with an opening 74, which is used for the carry-in of the wafer W into the chamber 1 and the carry-out of the wafer W from the chamber 1. The opening 74 is opened or closed by the shutter 20 with respect to the inside of the chamber 1. In addition, a gate valve G is provided outside the chamber 1 to open or close the opening 74.

When the shutter 20 moves upward, the opening 74 is closed from the inside of the chamber 1 by the shutter 20. FIGS. 1 and 2 illustrate the plasma processing apparatus 10 in a state where the opening 74 is closed by the shutter 20. In addition, when the shutter 20 moves downward, the opening 74 is opened in the inside of the chamber 1.

The inner wall of the chamber 1 is provided with a first connection unit 18a for connecting the shutter 20 to a ground potential. The first connection unit 18a is provided along the sidewall of the chamber 1 so as to surround the shutter 20. In addition, the inner wall member 3a is provided with a second connection unit 18b for connecting the shutter 20 to the ground potential. The second connection unit 18b is provided along the inner wall member 3a so as to surround the placing table 2. The first connection unit 18a and the second connection unit 18b are electrically connected to the grounded chamber 1. Therefore, when the first connection unit 18a and the second connection unit 18b are connected to the shutter 20, the shutter 20 is connected to the ground potential via the chamber 1. The first connection unit 18a and the second connection unit 18b are connected to a connection controller 19. The connection controller 19 controls the first connection unit 18a and the second connection unit 18b, thereby connecting the first connection unit 18a and the second connection unit 18b to the shutter 20 when the shutter 20 is in the position closing the opening 74.

The first connection unit 18a and the second connection unit 18b move a conductive member, which is connected to the chamber 1, in a direction, which is different from the Z-axis direction, under the control of the connection controller 19. In the present example, the first connection unit 18a moves the conductive member connected to the chamber 1 in a direction approaching the Z-axis under the control of the connection controller 19. Meanwhile, the second connection unit 18b moves the conductive member connected to the chamber 1 in a direction away from the Z-axis under the control of the connection controller 19. Thereby, the conductive member connected to the chamber 1 and the shutter 20 are brought into contact with each other and the shutter 20 is connected to the ground potential via the chamber 1 so that the entire shutter 20 functions as a high-frequency return path.

Here, descriptions will be made assuming a case where, for example, a conductive seal material, which is called a spiral, is disposed between the shutter 20 and the chamber 1, and when closing the opening 74, the shutter 20 moves upward so that the spiral is crushed by the shutter 20, whereby the conduction between the shutter 20 and the chamber 1 is implemented. In this case, the drive unit 22 that moves the shutter 20 is required to exert a force to crush the spiral, in addition to a drive force to move the shutter 20. Therefore, the drive unit 22 is required to exert a large drive force, which causes an increase in the size of the drive unit 22, and consequently, an increase in the size of the plasma processing apparatus 10 in which the plurality of drive units 22 is provided.

In addition, it has been studied to provide an annular shutter 20 in the chamber 1 to surround a processing space S in order to further equalize the effect of the shutter 20 on plasma in the circumferential direction of the wafer W within the processing space S. In such an annular shutter 20, since the area in which the spiral is disposed is increased when the spiral disposed between the shutter 20 and the chamber 1 is crushed, the drive unit 22 is required to exert a larger drive force.

In contrast, in the plasma processing apparatus 10 of the present example, when the shutter 20 moves to the position for closing the opening 74, the first connection unit 18a and the second connection unit 18b bring the conductive member connected to the chamber 1 into contact with the shutter 20. Therefore, when closing the opening 74, the drive unit 22 may move the shutter 20 to the position to close the opening 74 and does not need to apply a force required to crush the spiral to the shutter 20.

In addition, in the plasma processing apparatus 10 of the present example, the first connection unit 18a and the second connection unit 18b move the conductive member in a direction, which is different from the Z-axis direction in which the shutter 20 moves, thereby brining the conductive member connected to the chamber 1 into contact with the shutter 20. Therefore, the drive unit 22 is not required to apply, to the shutter 20, a reaction force against a force, by which the first connection unit 18a and the second connection unit 18b press the conductive member against the shutter 20. Therefore, in the plasma processing apparatus 10 of the present example, the drive unit 22 may be reduced in size. Thereby, the plasma processing apparatus 10 having the plurality of drive units 22 may be reduced in size.

In addition, in the present example, the shutter 20 is formed in an annular shape, and the first connection unit 18a and the second connection unit 18b bring the conductive member into contact with the shutter 20 over substantially the entire circumference of the shutter 20. Therefore, in force applied by the first connection unit 18a to the shutter 20 in order to bring the conductive member into contact with the shutter 20, the force applied by two first connection units 18a, which are opposite each other with the Z-axis interposed therebetween, to the shutter 20 acts such that one side force is a reaction force against the other side force. Likewise, in the force applied by the second connection unit 18b to the shutter 20 in order to bring the conductive member into contact with the shutter 20, the force applied by two second connection units 18b, which are opposite each other with the Z-axis interposed therebetween, to the shutter 20 acts such that one side force is a reaction force against the other side force. Accordingly, a force to bring the conductive member into contact with the shutter 20 by the first connection unit 18a and the second connection unit 18b may be increased regardless of the drive force of the drive unit 22. Thereby, the conductive member connected to the chamber 1 and the shutter 20 may be reliably brought into contact with each other, whereby the shutter 20 may be reliably connected to the ground potential over substantially the entire circumference of the shutter 20.

The description returns to the description of the plasma processing apparatus 10. The central axis of the substantially circular exhaust port 83 coincides with the Z-axis. An exhaust device 84 is connected to the exhaust port 83. The exhaust device 84 includes, for example, a vacuum pump such as, for example, a turbo molecular pump, and may depressurize the inside of the chamber 1 to a desired degree of vacuum. In addition, the exhaust port 83 is provided with an Automatic Pressure Controller (APC) 80. The APC 80 includes a cover 81 and a plurality of support rods 82. The cover 81 is a substantially circular plate, and the center axis of the cover 81 coincides with the Z-axis. In addition, the cover 81 is disposed so as to be substantially parallel to the opening surface of the exhaust port 83. The diameter of the cover 81 is greater than the diameter of an opening in the exhaust port 83.

The support rods 82 may control the height of the cover 81, thereby controlling an exhaust conductance, which is formed by a gap between the chamber 81 and the surface of the chamber 1 around the exhaust port 83. Although two support rods 82 are illustrated in FIG. 1, three or more support rods 82 are provided around the exhaust port 83 so as to surround the exhaust port 83. By controlling the height of the cover 81 using the support rods 82, the APC 80 may control the pressure in the chamber 1 to a predetermined pressure range.

In the pedestal 100 and the support beams 101, for example, as illustrated in FIGS. 1 to 3, a space 102 is formed therein. The space 102 is in communication with an opening formed in the sidewall of the chamber 1. For example, a gas or power to be supplied to the placing table 2 is supplied to the placing table 2 through a pipe or a wire that passes through the space 102 in the pedestal 100 and the support beams 101. In the present example, for example, as illustrated in FIGS. 3 and 4, the pedestal 100 is supported by three support beams 101. In the plasma processing apparatus 10 illustrated in FIG. 1, although the pipe or the wire, which supplies, for example, a gas or power to the placing table 2, is connected to a device outside the chamber 1 via one support beam 101, it may be connected to the device outside the chamber 1 via any one of the three support beams 101.

The upper electrode 16 is provided above the lower electrode 2a to be opposite the placing table 2. The lower electrode 2a and the upper electrode 16 are provided in the chamber 1 to be substantially parallel to each other. Hereinafter, the space between the wafer W disposed on the electrostatic chuck 6 and the lower surface of the upper electrode 16 is referred to as the processing space S.

The upper electrode 16 is supported in the upper portion of the chamber 1 via an insulating member 45. The upper electrode 16 includes a ceiling plate support 16a and an upper ceiling plate 16b. The ceiling plate support 16a is formed by, for example, aluminum, the surface of which is anodized, and detachably supports the upper ceiling plate 16b under the upper ceiling plate 16b. The upper ceiling plate 16b is formed of a silicon-containing material such as, for example, quartz.

A gas diffusion chamber 16c is provided within the ceiling plate support 16a. In the present example, the gas diffusion chamber 16c has a substantially cylindrical shape, and the center axis thereof coincides with the Z-axis. A plurality of gas distribution holes 16f is formed in the bottom portion of the ceiling 16a to be located below the gas diffusion chamber 16c. The plurality of gas distribution holes 16e is formed concentrically about the Z-axis at a substantially equivalent interval below the gas diffusion chamber 16c.

A plurality of gas distribution holes 16f is provided in the upper ceiling plate 16b so as to penetrate the upper ceiling plate 16b in the thickness direction. The plurality of gas distribution holes 16f is formed concentrically about the Z-axis at a substantially equivalent interval in the upper ceiling plate 16b. Each gas distribution hole 16f is in communication with one of the gas distribution holes 16e. A processing gas supplied to the gas diffusion chamber 16c diffuses in a shower form and is supplied into the chamber 1 through the plurality of gas distribution holes 16e and 16f. In addition, since the plurality of gas distribution holes 16e and 16f are arranged concentrically about the Z-axis at a substantially equivalent interval, the processing gas to be supplied into the chamber 1 through the plurality of gas distribution holes 16e and 16f is supplied into the processing space S at a substantially uniform flow rate in the circumferential direction about the Z-axis.

In addition, for example, the ceiling plate support 16a is provided with a heater (not illustrated) or a temperature adjustment mechanism such as, for example, a pipe (not illustrated) for circulating a coolant, so that the upper electrode 16 may be controlled to a temperature within a desired range during the processing of the wafer W.

The ceiling plate support 16a of the upper electrode 16 is provided with a gas inlet 16g for introducing a processing gas into the gas diffusion chamber 16c. In the present example, the center axis of the gas inlet 16g coincides with the Z-axis. One end of a pipe 15b is connected to the gas inlet 16g. The other end of the pipe 15b is connected to a gas supply source 15, which supplies a processing gas used for the processing of the wafer W, via a valve V and a mass flow controller (MFC) 15a. The processing gas supplied from the gas supply source 15 is supplied to the gas diffusion chamber 16c through the pipe 15b, and diffuses in a shower form and is supplied into the chamber 1 through the gas distribution holes 16e and 16f.

The upper electrode 16 is electrically connected to a variable DC power supply 42, which outputs a negative DC voltage, via a low pass filter (LPF) 40 and a switch 41. The switch 41 controls the application and interruption of a DC voltage from the variable DC power supply 42 to the upper electrode 16. For example, when high-frequency power is applied from the high-frequency power source 12a and the high-frequency power source 12b to the lower electrode 2a so that plasma is generated in the processing space S in the chamber 1, the switch 41 is turned on as needed, so that a negative DC voltage having a predetermined magnitude is applied to the upper electrode 16.

In addition, a ring magnet 90 is concentrically disposed around the chamber 1. The ring magnet 90 produces a magnetic field in the processing space S between the upper electrode 16 and the placing table 2. The ring magnet 90 is rotatably held by a rotating mechanism (not illustrated).

In the plasma processing apparatus 10 configured as described above, the operations thereof are collectively controlled by a controller 60. The controller 60 includes a process controller 61, which includes a Central Processing Unit (CPU) and controls respective parts of the plasma processing apparatus 10, a user interface 62, and a storage unit 63.

The user interface 62 includes, for example, a keyboard, which is used by an operator to input, for example, a command for operating the plasma processing apparatus 10, or a display, which visualizes and displays an operating state of the plasma processing apparatus 10.

The storage unit 63 stores control programs (software) for allowing the process controller 61 to realize various processings executed in the plasma processing apparatus 10 or a recipe in which, for example, data of processing conditions are stored. The process controller 61 reads the control programs stored in the storage unit 63, and operates based on the read control programs. In addition, the process controller 61 reads, for example, the recipe from the storage unit 63 in response to, for example, an instruction received via the user interface 62, and controls the plasma processing apparatus 10 based on, for example, the read recipe. Thereby, a desired processing is performed by the plasma processing apparatus 10. In addition, the process controller 61 may read, for example, a control program or a recipe, which is stored in, for example, a computer readable recording medium, from the recording medium, and may execute the same. The computer readable recording medium is, for example, a hard disk, a Digital Versatile Disc (DVD), a flexible disk, or a semiconductor memory. In addition, the process controller 61 may acquire, for example, a control program or a recipe, which is stored in a storage unit of another device, from the other device through, for example, a communication line and may execute the same.

In the plasma processing apparatus 10, when a processing using plasma is performed on the wafer W, the controller 60 performs, for example, the following control on the plasma processing apparatus 10. First, the controller 60 controls the connection controller 19 such that the first connection unit 18a and the second connection unit 18b separate the conductive member connected to the shutter 1 from the shutter 20. Then, the controller 60 controls the drive unit 22 to move the shutter 20 downward, thereby opening the inner side of the opening 74. Then, the controller 60 opens the gate valve G. Thereby, the wafer W to be processed is carried onto the electrostatic chuck 6 through the opening 74.

Next, the controller 60 closes the gate valve G. Then, the controller 60 controls the drive unit 22 to move the shutter 20 upward, thereby closing the inner side of the opening 74. Then, the controller 60 controls the connection controller 19 so that the first connection unit 18a and the second connection unit 18b bring the conductive member connected to the chamber 1 into contact with the shutter 20. Thereby, the entire shutter 20 is connected to the ground potential via the chamber 1.

Next, the controller 60 operates the exhaust device 84 and controls the APC 80 to vacuum evacuate the inside of the chamber 1. Then, the controller 60 controls the valve V and the MFC 15a to supply a processing gas into the gas diffusion chamber 16c at a predetermined flow rate. The processing gas supplied into the gas diffusion chamber 16c diffuses in a shower form and is supplied into the chamber 1 through the plurality of gas distribution holes 16e and 16f. In addition, the controller 60 controls an exhaust conductance by the APC 80, thereby controlling the inside of the chamber 1 to a predetermined pressure.

Then, the controller 60 controls the high-frequency power source 12a and the high-frequency power source 12b to generate predetermined high-frequency power and apply the same to the lower electrode 2a, and also controls the switch 41 to be turned on so as to apply a predetermined DC voltage to the upper electrode 16. Thereby, the plasma of the processing gas is generated in the processing space S between the wafer W on the electrostatic chuck 6 and the upper electrode 16. In addition, a predetermined processing such as, for example, etching is performed on the wafer W disposed on the electrostatic chuck 6 by ions and radicals contained in the plasma generated in the processing space S.

[Configuration of First Connection Unit 18a and Second Connection Unit 18b]

Figure 6A:
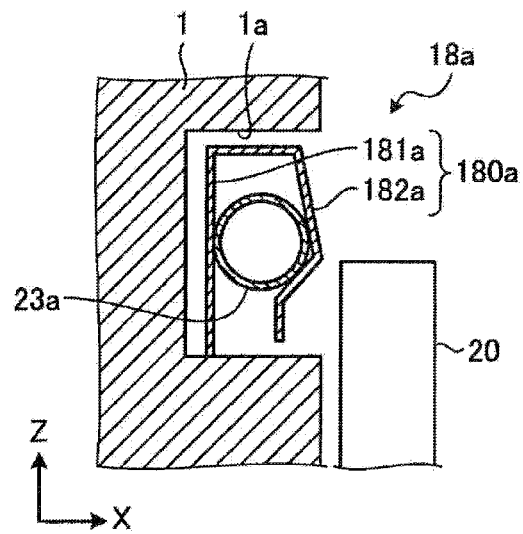
FIGS. 6A and 6B are views for explaining an exemplary first connection unit according to Example 1.
Figure 6B:
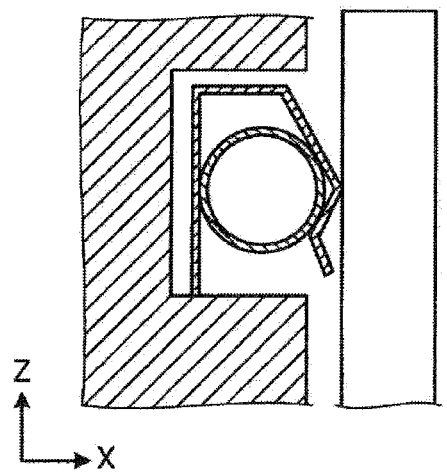

FIGS. 6A and 6B are views for explaining an example of the first connection unit 18a according to Example 1. In the present example, for example, as illustrated in FIG. 6A, the first connection unit 18a is provided in a concave portion 1a, which is formed in the sidewall of the chamber 1, and includes a contact member 180a formed of a conductive material and a tube 23a formed of an elastic material.

Figure 7:
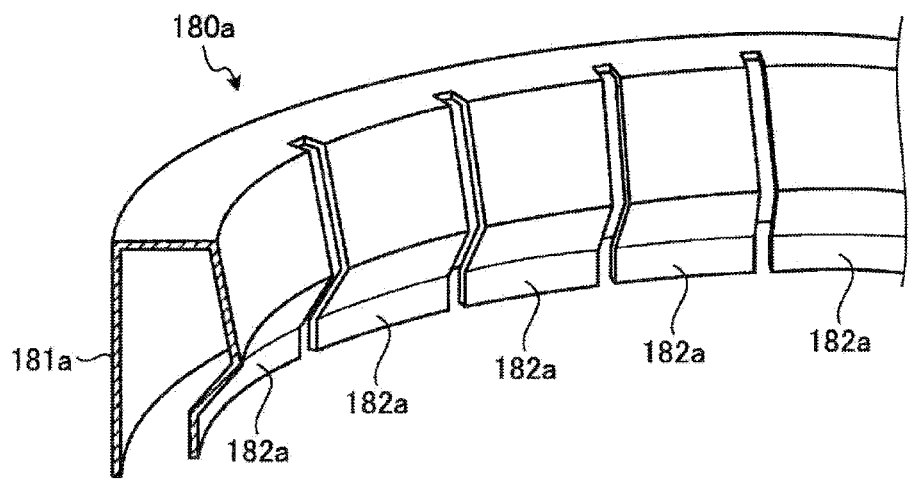
FIG. 7 is a view illustrating an exemplary configuration of a contact member.

The contact member 180a is electrically connected to the chamber 1. For example, as illustrated in FIG. 7, the contact member 180a includes a base portion 181a formed in an annular shape and a plurality of contact portions 182a, which is provided on the base portion 181a along the base portion 181a. In the present example, the base portion 181a and the respective contact portions 182a are integrally formed by a conductive material. In addition, a gap is formed between adjacent contact portions 182a. In the present example, the contact member 180a is, for example, a leaf spring, and the contact portions 182a are, for example, a portion of the leaf spring.

The tube 23a is formed in an annular shape, and is disposed along the base portion 181a between the base portion 181a and the respective contact portions 182a. The tube 23a is connected to the connection controller 19, and the pressure of a fluid filled therein is controlled by the connection controller 19. In the present example, the fluid filled in the tube 23a is, for example, a gas such as air. In addition, the fluid filled in the tube 23a may be a liquid such as, for example, oil.

The connection controller 19 controls the pressure of the fluid filled in the tube 23a, thereby controlling the connection between the first connection unit 18a and the shutter 20. Specifically, for example, as illustrated in FIG. 6A, the connection controller 19 lowers the pressure of the fluid filled in the tube 23a when the shutter 20 is in a position other than the position for closing the opening 74 (including when the shutter 20 is moving). Thereby, the tube 23a contracts, and the contact portions 182a move in a direction (e.g., in the −X direction of FIG. 6A), which is different from the direction of movement of the shutter 20 (the Z-axis direction in FIG. 6A). Thereby, the contact portions 182a retreat from the movement path of the shutter 20 toward the base portion 181a. Therefore, the contact between the shutter 20 and the contact portions 182a is avoided when the shutter 20 moves, which may prevent the generation of particles due to the friction between the shutter 20 and the contact portions 182a.

In addition, for example, as illustrated in FIG. 6B, the connection controller 19 raises the pressure of the fluid filled in the tube 23a when the shutter 20 is in the position for closing the opening 74. Thereby, the tube 23a expands, and the contact portions 182a move in a direction (e.g., the +X direction of FIG. 6B), which is different from the direction of movement of the shutter 20 (the Z-axis direction of FIG. 6B). Thereby, the contact portions 182a move toward the shutter 20. Therefore, the contact portions 182a are brought into contact with the shutter 20, and the shutter 20 is connected to the ground potential via the contact portions 182a.

In addition, in the present example, although the contact portions 182a are brought into contact with the wall portion 20a or separated from the wall portion 20a, via the expansion and contraction of the tube 23a, by using the contact member 180a having the base portion 181a and the contact portions 182a, the disclosed technique is not limited thereto. For example, the plurality of contact portions 182a may be disposed in the concave portion 1a, which is formed in the chamber 1 along the chamber 1, one end of each contact portion 182a may be fixed to the chamber 1, and the tube 23a may be disposed between each contact portion 182a and the chamber 1 so that the other end of the contact portion 182a is brought into contact with the shutter 20 or is separated from the shutter 20 via the expansion and contraction of the tube 23a.

Figure 8A:
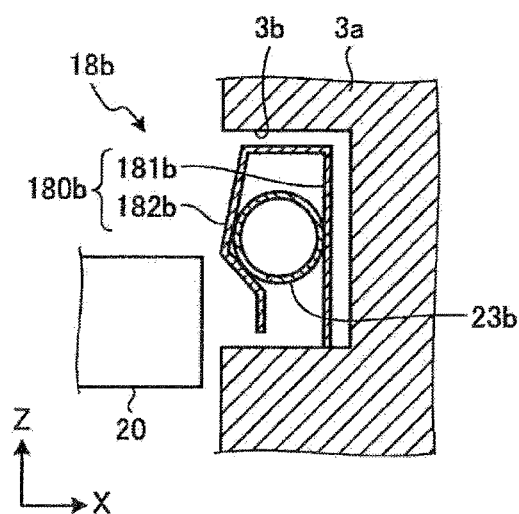
FIGS. 8A and 8B are views for explaining an exemplary second connection unit according to Example 1.
Figure 8B:
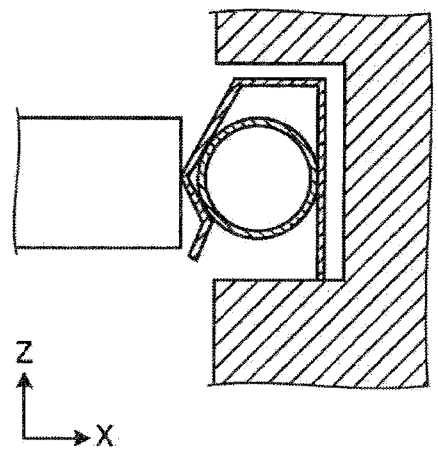

FIGS. 8A and 8B are views for explaining an example of the second connection unit 18b according to Example 1. In the present example, for example, as illustrated in FIG. 8A, the second connection unit 18b is provided in a concave portion 3b, which is formed in the inner wall member 3a, and includes a contact member 180b formed of a conductive material and a tube 23b formed of a material having elasticity.

The contact member 180b is connected to the ground potential by a wire (not illustrated). For example, the contact member 180b has the same structure as the first connection unit 18a illustrated in FIG. 7. However, in the contact member 180b, a plurality of contact portions 182b is arranged along a base portion 181b, which is formed in an annular shape, on the outer side of the base portion 181b.

The tube 23b is formed in an annular shape, and is disposed along the base portion 181b between the base portion 181b and the respective contact portions 182b. The tube 23b is connected to the connection controller 19, and the pressure of a fluid filled therein is controlled by the connection controller 19. The connection controller 19 controls the pressure of the fluid filled in the tube 23b, thereby controlling the connection between the second connection unit 18b and the shutter 20. Specifically, for example, as illustrated in FIG. 8A, the connection controller 19 lowers the pressure of the fluid filled in the tube 23b when the shutter 20 is in a position other than the position for closing the opening 74 (including when the shutter 20 is moving). Thereby, the tube 23b contracts, and the contact portions 182b move in a direction (e.g., in the +X direction of FIG. 8A), which is different from the direction of movement of the shutter 20 (the Z-axis direction of FIG. 8A). Thereby, the contact portions 182b retreat from the movement path of the shutter 20 toward the base portion 181b. Therefore, the contact between the shutter 20 and the contact portions 182b is avoided when the shutter 20 moves, which may prevent the generation of particles due to the friction between the shutter 20 and the contact portions 182b.

In addition, for example, as illustrated in FIG. 8B, the connection controller 19 raises the pressure of the fluid filled in the tube 23b when the shutter 20 is in the position for closing the opening 74. Thereby, the tube 23b expands, and the contact portions 182b move in a direction (e.g., the −X direction of FIG. 8B), which is different from the direction of movement of the shutter 20 (the Z-axis direction of FIG. 8B). Thereby, the contact portions 182b move toward the shutter 20. Therefore, the contact portions 182b are brought into contact the shutter 20 and the shutter 20 is connected to the ground potential via the contact portions 182b.

The plasma processing apparatus 10 according to Example 1 has been described above. As be apparent from the above description, according to the plasma processing apparatus 10 of the present example, the drive unit 22, which drives the shutter 20, may be reduced in size, and consequently, the plasma processing apparatus 10 having the drive unit 22 may be reduced in size.

EXAMPLE 2

In Example 2, the configuration of the first connection unit 18a, the second connection unit 18b, and the connection controller 19 are different from that in Example 1. In addition, the configuration excluding the first connection unit 18A, the second connection unit 18b, and the connection controller 19, for example, the entire configuration of the plasma processing apparatus 10 is the same as that of the plasma processing apparatus 10 described in Example 1, and thus, a detailed description thereof will be omitted.

[Configuration of First Connection Unit 18a and Second Connection Unit 18b]

Figure 9A:
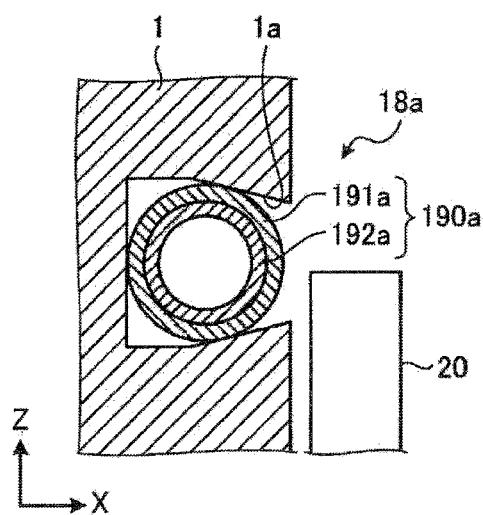
FIGS. 9A and 9B are views for explaining an exemplary first connection unit according to Example 2.
Figure 9B:
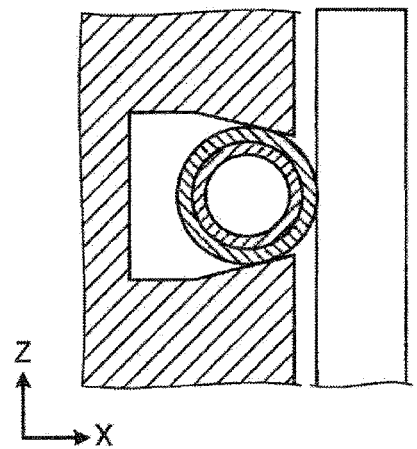

FIGS. 9A and 9B are views for explaining an example of the first connection unit 18a according to Example 2. In the present example, for example, as illustrated in FIG. 9A, the first connection unit 18a includes a tube 190a provided in the concave portion 1a, which is formed in the side wall of the chamber 1. The concave portion 1a is a groove formed along the sidewall of the chamber 1, and for example, as illustrated in FIG. 9A, the opening of the groove is narrower than the bottom of the groove. The tube 190a is formed in an annular shape and disposed in the concave portion 1a along the concave portion 1a. That is, the annular shutter 20 is disposed inside the rim of the annular tube 190a when viewing in the Z-axis direction. The tube 190a includes an inner layer 192a, which is formed of an elastic material, and an outer layer 191a, which covers the outer side of the inner layer 192a and is formed of an elastic and conductive material. The outer layer 191a is in contact with the inner wall of the concave portion 1a, i.e. the chamber 1, and is connected to the ground potential via the chamber 1. The tube 190a is connected to the connection controller 19, and the pressure of a fluid filled in the tube 190a is controlled by the connection controller 19. The tube 190a is an exemplary contact portion.

The connection controller 19 controls the pressure of the fluid filled in the tube 190a, thereby controlling the connection between the outer layer 191a and the shutter 20. Specifically, for example, as illustrated in FIG. 9A, the connection controller 19 raises the pressure of the fluid filled in the tube 190a when the shutter 20 is in a position other than the position for closing the opening 74 (including when the shutter 20 is moving). Thereby, the annular tube 190a expands, and the inner diameter of the tube 190a becomes greater than the outer diameter of the shutter 20 when viewing in the Z-axis direction. Thereby, the tube 190a moves in a direction (e.g., the −X direction of FIG. 9A), which is different from the direction of movement of the shutter 20 (the Z-axis direction of FIG. 9A). Thereby, the tube 190a retreats from the movement path of the shutter 20 toward the sidewall of the chamber 1. Therefore, the contact between the shutter 20 and the tube 190a is avoided when the shutter 20 moves, which may prevent the generation of particles due to the friction between the shutter 20 and the tube 190a.

In addition, for example, as illustrated in FIG. 9B, the connection controller 19 lowers the pressure of the fluid filled in the tube 190a when the shutter 20 is in the position for closing the opening 74. Thereby, the annular tube 190a contracts, and the inner diameter of the tube 190a is reduced so that the outer diameter of the shutter 20 becomes approximately the same as the inner diameter of the tube 190a when viewing in the Z-axis direction. Thereby, the tube 190a moves in a direction (e.g., the +X direction of FIG. 9A), which is different from the direction of movement of the shutter 20 (the Z-axis direction of FIG. 9B). Thereby, the tube 190a moves toward the shutter 20. Therefore, the outer layer 191a of the tube 190a is brought into contact with the shutter 20. At this time, the outer layer 191a of the tube 190a is brought into contact with the vicinity of an opening of the concave portion 1a. Thereby, the shutter 20 is connected to the ground potential via the outer layer 191a of the tube 190a.

In addition, although the tube 190a having the outer layer 191a and the inner layer 192a is used in the present example, the tube 190a may be a single-layer tube formed of an elastic and conductive material such as, for example, a resin. In addition, in the tube 190a of the present embodiment, although the inner layer 192a is covered with the outer layer 191a over the entire circumference of the cross section, the disclosed technique is not limited thereto. Only a portion of the tube 190a that is in contact with the chamber 1 and the shutter 20 may be covered with the outer layer 191a.

Figure 10A:
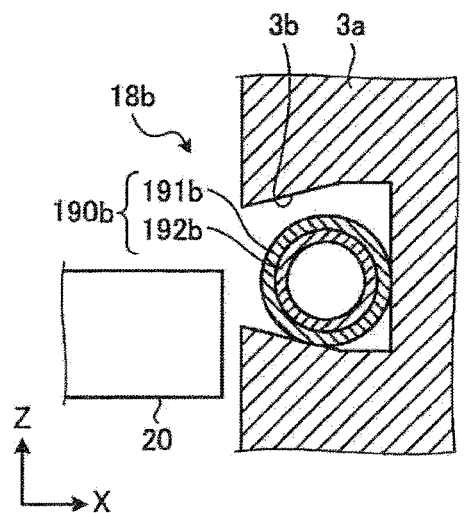
FIGS. 10A and 10B are views for explaining an exemplary second connection unit according to Example 2.
Figure 10B:
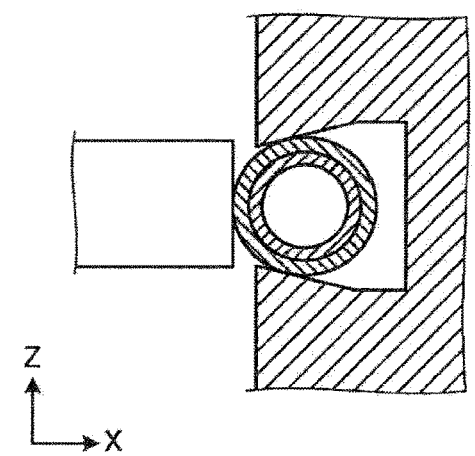

FIGS. 10A and 10B are views for explaining an example of the second connection unit 18b according to Example 2. In the present example, for example, as illustrated in FIG. 10A, the second connection unit 18b includes a tube 190b provided in the concave portion 3b, which is formed in the inner wall member 3a. The concave portion 3b is a groove formed along the outer wall of the inner wall member 3a, and as illustrated in FIG. 10A, the opening of the groove is narrower than the bottom of the groove. The tube 190b is formed in an annular shape and disposed in the concave portion 3b along the concave portion 3b. That is, the annular shutter 20 is disposed outside the rim of the annular tube 190b when viewing in the Z-axis direction. The tube 190b includes an inner layer 192b, which is formed of a material having elasticity, and an outer layer 191b, which covers the outer side of the inner layer 192b and is formed of an elastic and conductive material. The outer layer 191b is connected to the ground potential via a wire (not illustrated). The tube 190b is connected to the connection controller 19, and the pressure of a fluid filled in the tube 190b is controlled by the connection controller 19.

The connection controller 19 controls the pressure of the fluid filled in the tube 190b, thereby controlling the connection between the outer layer 191b and the shutter 20. Specifically, for example, as illustrated in FIG. 10A, the connection controller 19 lowers the pressure of the fluid filled in the tube 190b when the shutter 20 is in a position other than the position for closing the opening 74 (including when the shutter 20 is moving). Thereby, the annular tube 190b contracts, and the outer diameter of the tube 190b becomes shorter than the inner diameter of the shutter 20 when viewing in the Z-axis direction. Thereby, the tube 190b moves in a direction (e.g., the +X direction of FIG. 10A), which is different from the direction of movement of the shutter 20 (the Z-axis direction of FIG. 10A). Thereby, the tube 190a retreats from the movement path of the shutter 20 toward the inner wall member 3a. Therefore, the contact between the shutter 20 and the tube 190b is avoided when the shutter 20 moves, which may prevent the generation of particles due to the friction between the shutter 20 and the tube 190b.

In addition, for example, as illustrated in FIG. 10B, the connection controller 19 raises the pressure of the fluid filled in the tube 190b when the shutter 20 is in the position for closing the opening 74. Thereby, the annular tube 190b expands, and the outer diameter of the tube 190b is increased such that the inner diameter of the shutter 20 becomes approximately the same as the outer diameter of the tube 190b when viewing in the Z-axis direction. Thereby, the tube 190b moves in a direction (e.g., the −X direction of FIG. 10B), which is different from the direction of movement of the shutter 20 (the Z-axis direction of FIG. 10B). Thereby, the tube 190b moves toward the shutter 20 about the Z-axis. Therefore, the outer layer 191b of the tube 190b is brought into contact with the shutter 20, and the shutter 20 is connected to the ground potential via the outer layer 191b.

EXAMPLE 3

In Example 3, the configuration of the first connection unit 18a, the second connection unit 18b, and the connection controller 19 is different from that in Example 1. In addition, the configuration excluding the first connection unit 18A, the second connection unit 18b, and the connection controller 19, for example, the entire configuration of the plasma processing apparatus 10 is the same as that of the plasma processing apparatus 10 described in Example 1, and thus, a detailed description thereof will be omitted. In addition, since the first connection unit 18a and the second connection unit 18b have the same configuration, hereinafter, the configuration of the second connection unit 18b will be mainly described.

Figure 11A:
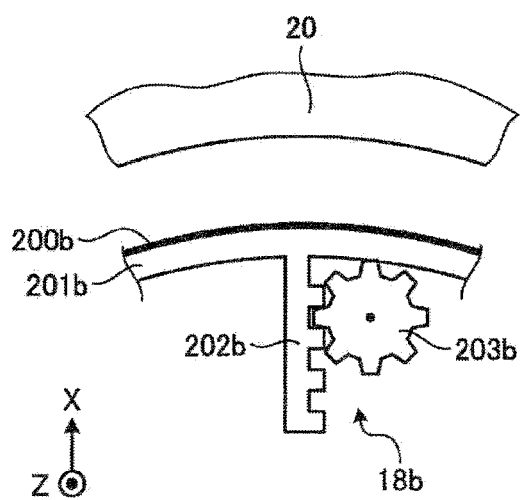
FIGS. 11A and 11B are views for explaining an exemplary second connection unit according to Example 3.
Figure 11B:
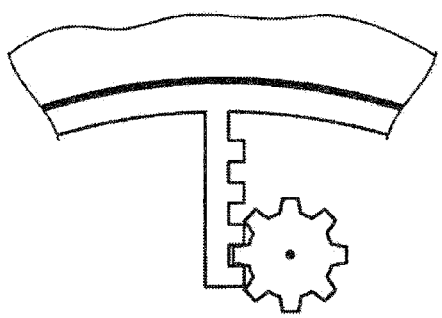

[Configuration of Second Connection Unit 18b]
FIGS. 11A and 11B are views for explaining an example of the second connection unit 18b according to Example 3. FIGS. 11A and 11B schematically illustrate the second connection unit 18b and the shutter 20 when viewing in the Z-axis direction. In the present example, for example, as illustrated in FIG. 11A, the second connection unit 18b includes a base 201b provided with a rack 202b and a gear 203b.

The base 201b is disposed closer to the Z-axis than the bottom portion 20b of the shutter 20. The surface of the base 201b toward the shutter 20 is formed in an arc shape along the bottom portion 20b of the shutter 20. In addition, the second connection unit 18b illustrated in FIG. 11A is disposed along the inner side of the bottom portion 20b of the shutter 20, and is divided into several blocks (e.g., four blocks) in the circumferential direction of the circle that is formed by the inner wall of the bottom portion 20b of the shutter 20. The respective blocks are arranged at a predetermined interval in the circumferential direction. A spiral 200b, which is a conductive seal member, is disposed on the surface of the base 201b toward the shutter 20. The spiral 200b is connected to the ground potential by a wire (not illustrated).

The gear 203b is engaged with teeth formed on the rack 202b, and is rotated by driving of a motor (not illustrated). The motor is connected to the connection controller 19. As the gear 203b is rotated counterclockwise, for example, as illustrated in FIG. 11A, the shutter 20 and the spiral 200b are separated from each other. On the other hand, as the gear 203b is rotated clockwise, for example, as illustrated in FIG. 11B, the shutter 20 and the spiral 200b are brought into contact with each other. The connection controller 19 controls the motor so as to rotate the gear 203b, thereby controlling the separation and contact of the shutter and the spiral 200b.

In the present example, for example, as illustrated in FIG. 11A, the connection controller 19 controls the motor to rotate the gear 203b counterclockwise when the shutter 20 is in a position other than the position for closing the opening 74 (including when the shutter 20 is moving). Thereby, the base 201b moves in a direction (e.g., the −X direction of FIG. 11A), which is different from the direction of movement of the shutter 20 (the Z-axis direction of FIG. 11A). Thereby, the spiral 200b provided on the base 201b retreats from the movement path of the shutter 20 toward the gear 203b. Therefore, the contact between the shutter 20 and the spiral 200b is avoided when the shutter 20 moves, which may prevent the generation of particles due to the friction between the spatter 20 and the spiral 200b.

In addition, for example, as illustrated in FIG. 11B, the connection controller 19 controls the motor to rotate the gear 203b clockwise when the shutter 20 is in the position for closing the opening 74. Thereby, the base 201b moves in a direction (e.g., the +X direction of FIG. 11B), which is different from the direction of movement of the shutter 20 (the Z-axis direction of FIG. 11B). Thereby, the spiral 200b provided on the base 201b moves toward the shutter 20. Therefore, the spiral 200b is brought into contact with the shutter 20, and the shutter 20 is connected to the ground potential via the spiral 200b.

EXAMPLE 4

In Example 4, the configuration of the first connection unit 18a, the second connection unit 18b, and the connection controller 19 is different from that in Example 1. In addition, the configuration excluding the first connection unit 18A, the second connection unit 18b, and the connection controller 19, for example, the entire configuration of the plasma processing apparatus 10 is the same as that of the plasma processing apparatus 10 described in Example 1, and thus, a detailed description thereof will be omitted. In addition, since the first connection unit 18a and the second connection unit 18b have the same configuration, hereinafter, the configuration of the second connection unit 18b will be mainly described.

Figure 12A:
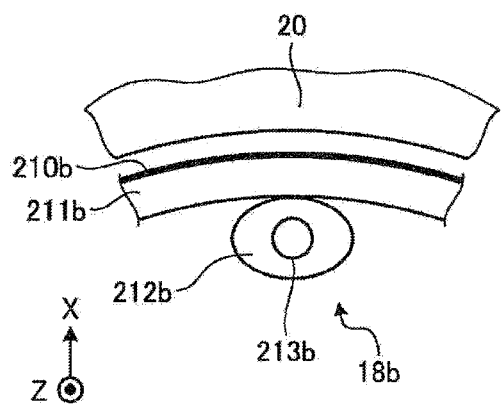
FIGS. 12A and 12B are views for explaining an exemplary second connection unit according to Example 4.
Figure 12B:
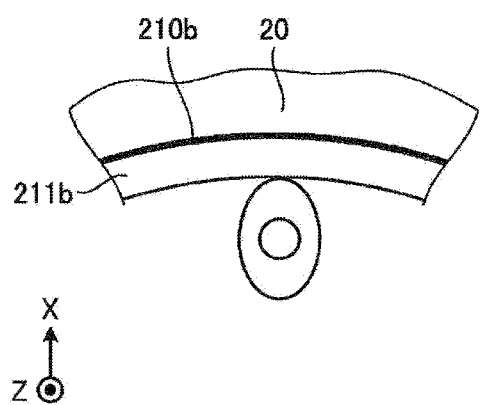

[Configuration of Second Connection Unit 18b]
FIGS. 12A and 12B are views for explaining an example of the second connection unit 18b according to Example 4. FIGS. 12A and 12B schematically illustrate the second connection unit 18b and the shutter 20 when viewing in the Z-axis direction. In the present example, for example, as illustrated in FIG. 12A, the second connection unit 18b includes a cam follower 211b and a cam 212b. The cam follower 211b is formed in an arc shape along the bottom portion 20b of the shutter 20. The cam follower 211b, which is disposed along the inner side of the bottom portion 20b of the shutter 20, is divided into several blocks (e.g., four blocks) in the circumferential direction of the circle that is formed by the inner wall of the bottom portion 20b. The respective blocks are arranged at a predetermined interval in the circumferential direction. The cam follower 211b and the cam 212b are an exemplary moving mechanism.

A spiral 210b, which is a conductive seal member, is disposed on the surface of the cam follower 211b toward the shutter 20. The spiral 200b is connected to the ground potential by a wire (not illustrated). The cam follower 211b is deflected to come into close contact with the cam 212b.

The cam 212b has, for example, an elliptical cross-sectional shape in the Z-axis direction, and is rotated about a shaft 213b. The shaft 213b is connected to a motor (not illustrated), and the motor is connected to the connection controller 19. The connection controller 19 controls the motor, thereby controlling the rotation angle of the cam 212b about the shaft 213b. In the present example, since the cam 212b has, for example, an elliptical cross-sectional shape in the Z-axis direction, when the cam 212b is rotated about the shaft 213b, the distance between the shaft 213b and the cam follower 211b varies in the direction crossing the Z-axis, for example, in the X-axis direction illustrated in FIGS. 12A and 12B. Thereby, the distance between the cam follower 211b and the shutter 20 varies depending on the rotation angle of the cam 212b.

In the present example, for example, as illustrated in FIG. 12A, the connection controller 19 controls the motor to rotate the cam 212b so that the cam follower 211b moves in a direction away from the shutter 20 when the shutter 20 is in a position other than the position for closing the opening 74 (including when the shutter 20 is moving). Thereby, the cam follower 211b moves in a direction (e.g., the X-axis direction of FIG. 12A), which is different from the direction of movement of the shutter 20 (the Z-axis direction of FIG. 12A). Thereby, the spiral 210b provided on the cam follower 211b retreats from the movement path of the shutter 20 toward the cam 212b. Therefore, the contact between the shutter 20 and the spiral 210b is avoided when the shutter 20 moves, which may prevent the generation of particles due to the friction between the shutter 20 and the spiral 210b.

In addition, for example, as illustrated in FIG. 12B, the connection controller 19 controls the motor to rotate the cam 212b so that the cam follower 211b moves in a direction approaching the shutter 20 when the shutter 20 is in the position for closing the opening 74. Thereby, the cam follower 211b moves in a direction (e.g., the +X direction of FIG. 12B), which is different from the direction of movement of the shutter 20 (the Z-axis direction of FIG. 12B). Thereby, the spiral 210b provided on the cam follower 211b moves toward the shutter 20. Therefore, the spiral 210b is brought into contact with the shutter 20, and the shutter 20 is connected to the ground potential via the spiral 210b.

In addition, in the present example, although the cross section of the cam 212b in the Z-axis direction is, for example, an elliptical shape, the cross section in the Z-axis direction may be any other shape such as, for example, a polygonal shape or a long round shape when the cam 212b has a shape in which the distance from the center of the shaft 213b to the outer periphery of the cam 212b is partially different.

EXAMPLE 5

In Example 5, the configuration of the first connection unit 18a, the second connection unit 18b, and the connection controller 19 is different from that in Example 1. In addition, the configuration excluding the first connection unit 18A, the second connection unit 18b, and the connection controller 19, for example, the entire configuration of the plasma processing apparatus 10 is the same as that of the plasma processing apparatus 10 described in Example 1, and thus, a detailed description thereof will be omitted. In addition, since the first connection unit 18a and the second connection unit 18b have the same configuration, hereinafter, the configuration of the first connection unit 18a will be mainly described.

[Configuration of First Connection Unit 18a]

Figure 13A:
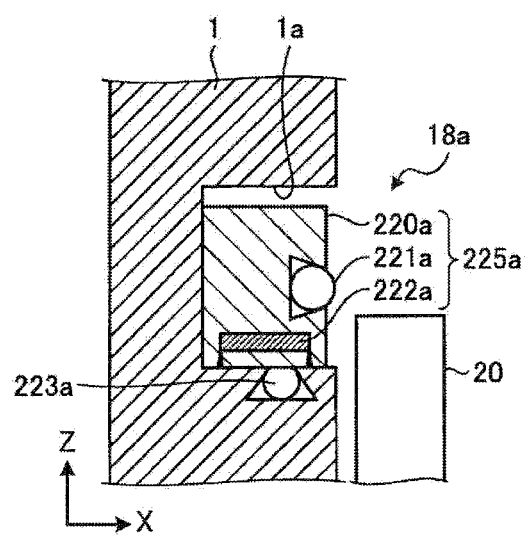
FIGS. 13A and 13B are views for explaining an exemplary second connection unit according to Example 5.
Figure 13B:
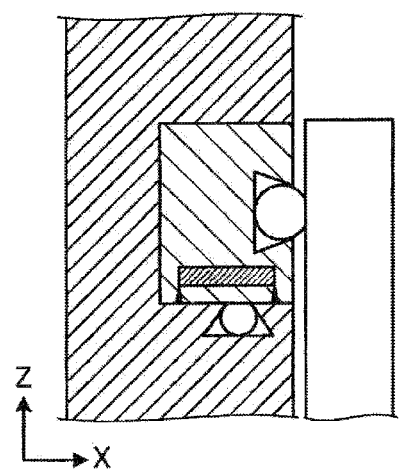

FIGS. 13A and 13B are views for explaining an example of the first connection unit 18a according to Example 5. In the present example, for example, as illustrated in FIG. 13A, the first connection unit 18a includes a deforming member 225a provided in the concave portion 1a, which is formed in the sidewall of the chamber 1. The deforming member 225a includes a holding member 220a, a spiral 221a, and a heater 222a. The holding member 220a is formed in an arc shape so as to extend along the concave portion 1a using a highly conductive material having a high thermal expansion coefficient such as, for example, copper. In addition, the holding member 220a is divided into several blocks (e.g., four blocks) in the circumferential direction of the circle that is formed by the outer wall of the wall portion 20a, and the respective blocks are arranged at a predetermined interval in the circumferential direction.

The holding member 220a holds the spiral 221a, which is a conductive seal member. The spiral 221a is an exemplary contact portion. The holding member 220a is connected to the chamber 1 via the spiral 223a, which is a conductive seal member provided in the concave portion 1a. The heater 222a is connected to the connection controller 19 via a wire (not illustrated). The heater 222a heats the holding member 220a by power supplied from the connection controller 19.

The connection controller 19 in the present example controls the power to be supplied to the heater 222a, thereby controlling the thermal expansion of the holding member 220a by the heater 222a. Specifically, for example, as illustrated in FIG. 13A, the connection controller 19 stops the supply of power to the heater 222a when the shutter 20 is in a position other than the position for closing the opening 74 (including when the shutter 20 is moving). Thereby, the holding member 220a contracts, and the spiral 221a moves in a direction (e.g., the –X direction of FIG. 13A), which is different from the direction of movement of the shutter 20 (the Z-axis direction of FIG. 13A). Thereby, the spiral 221a retreats from the movement path of the shutter 20 toward the sidewall of the chamber 1. Therefore, the contact between the shutter 20 and the spiral 221a is avoided when the shutter 20 moves, which may prevent the generation of particles due to the friction between the shutter 20 and the spiral 221a.

In addition, for example, as illustrated in FIG. 13B, the connection controller 19 supplies predetermined power to the heater 222a when the shutter 20 is in the position for closing the opening 74. Thereby, the holding member 220a thermally expands, and the spiral 221a moves in a direction (e.g., the +X direction of FIG. 13B), which is different from the direction of movement of the shutter 20 (the Z-axis direction of FIG. 13B). Thereby, the spiral 221a moves toward the shutter 20. Therefore, the spiral 221a is brought into contact with the shutter 20, and the shutter 20 is connected to the ground potential via the spiral 221a.

Figure 14:
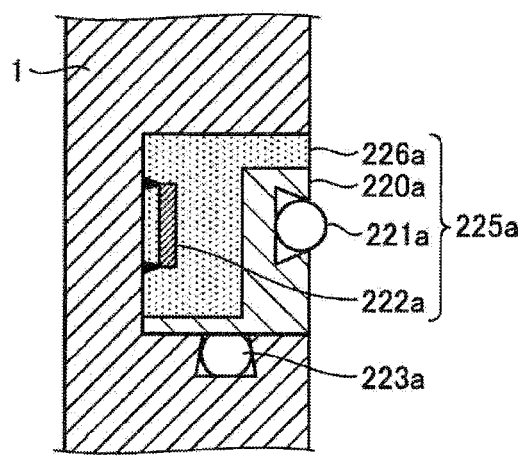
FIG. 14 is a view illustrating another exemplary modified member.
Figure 14:
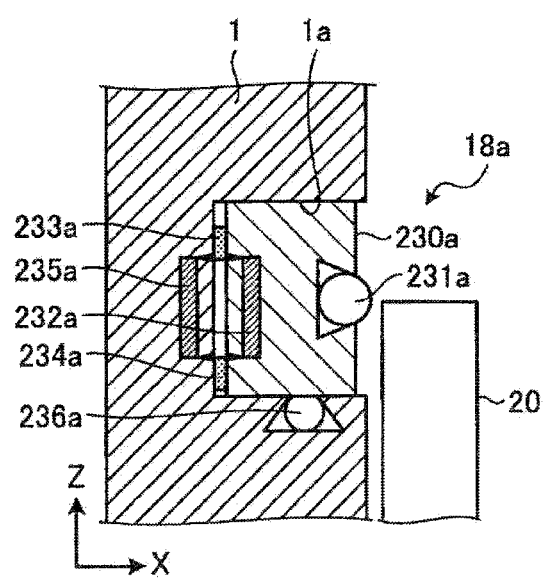
Figure 14:
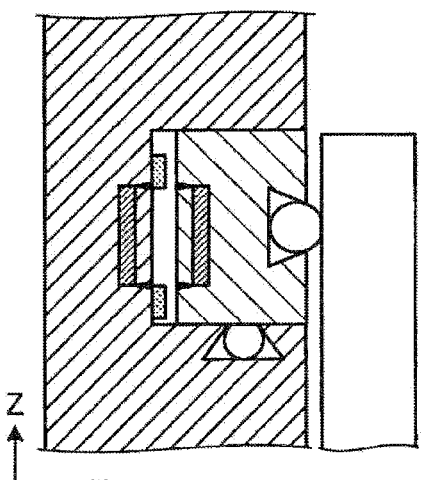

In addition, in the deforming member 225a illustrated in FIGS. 13A and 13B, for example, as illustrated in FIG. 14, a portion thereof that thermally expands may be formed of a resin 226a, and the spiral 221a and the holding member 220a, which is in contact with the spiral 223a, may be formed of a metal.

EXAMPLE 6

In Example 6, the configuration of the first connection unit 18a, the second connection unit 18b, and the connection controller 19 is different from that in Example 1. In addition, the configuration excluding the first connection unit 18A, the second connection unit 18b, and the connection controller 19, for example, the entire configuration of the plasma processing apparatus 10 is the same as that of the plasma processing apparatus 10 described in Example 1, and thus, a detailed description thereof will be omitted. In addition, since the first connection unit 18a and the second connection unit 18b have the same configuration, hereinafter, the configuration of the first connection unit 18a will be mainly described.

FIGS. 15A and 15B are views for explaining an example of the first connection unit 18a according to Example 6. In the present example, for example, as illustrated in FIG. 15A, the first connection unit 18a includes a holding member 230a provided in the concave portion 1a, which is formed in the sidewall of the chamber 1. The holding member 230a is formed in an arc shape to extend along the concave portion 1a using a material having high conductivity. In addition, the holding member 230a is divided into several blocks (e.g., four blocks) in the circumferential direction of the circle that is formed by the outer wall of the wall portion 20a, and the respective blocks are arranged at a predetermined interval in the circumferential direction.

The holding member 230a holds a spiral 231a, which is a conductive seal member. The spiral 231a is an exemplary contact portion. The holding member 230a is connected to the chamber 1 via a spiral 236a, which is a conductive seal member provided in the concave portion 1a. An electromagnet 232a is provided in the holding member 230a. An electromagnet 235a is provided at a position in the chamber 1 that corresponds to the electromagnet 232a in the holding member 230a. The electromagnet 232a and the electromagnet 235a are connected respectively to the connection controller 19 by wires (not illustrated). The electromagnet 232a and the electromagnet 235a generate a magnetic force by the control from the connection controller 19. In addition, within the concave portion 1a, a cushion material 233a and a cushion material 234a are provided between the chamber 1 and the holding member 230a. The holding member 230a is an exemplary first holding portion, and the chamber 1 is an exemplary second holding portion. In addition, the electromagnet 232a is an exemplary first electromagnet, and the electromagnet 235a is an exemplary second electromagnet.

The connection controller 19 in the present example controls the polarity of the magnetic force generated by the electromagnet 232a and the electromagnet 235a, thereby controlling the position of the holding member 230a. Specifically, for example, as illustrated in FIG. 15A, the connection controller 19 controls the electromagnet 232a and the electromagnet 235a to generate a magnetic force of the polarity in which the electromagnet 232a and the electromagnet 235a attract each other when the shutter 20 is in a position other than the position for closing the opening 74 (including when the shutter 20 is moving). Thereby, the holding member 230a moves in a direction (e.g., in the −X direction of FIG. 15A), which is different from the direction of movement of the shutter (the Z-axis direction of FIG. 15A). Thereby, the spiral 231a retreats from the movement path of the shutter 20 toward the sidewall of the chamber 1. Therefore, the contact between the shutter 20 and the spiral 231a is prevented when the shutter 20 moves, which may prevent the generation of particles due to the friction between the shutter 20 and the spiral 231a.

In addition, for example, as illustrated in FIG. 15(B, the connection controller 19 controls the electromagnet 232a and the electromagnet 235a to generate a magnetic force with the polarity in which the electromagnet 232a and the electromagnet 235a repel each other when the shutter 20 is in the position for closing the opening 74. Thereby, the holding member 230a moves in a direction (e.g., the +X direction of FIG. 15B), which is different from the direction of movement of the shutter 20 (the Z-axis direction of FIG. 15B). Thereby, the spiral 231a moves toward the shutter 20.

Therefore, the spiral 231a is brought into contact with the shutter 20, and the shutter 20 is connected to the ground potential via the spiral 231a.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a placing table;
a chamber having an opening in a sidewall thereof so as to carry a processing target substrate into the chamber through the opening, the chamber being configured to perform therein a predetermined processing on the processing target substrate placed on the placing table by plasma of a processing gas supplied thereinto;
a shutter configured to open or close the opening by moving along the sidewall of the chamber, the shutter made of a conductive material; and
a contact member connected to ground potential, the contact member formed of a conductive material and provided in a concave portion, the concave portion including a sidewall and a bottom wall inside of the concave portion, and being formed either (i) in the sidewall of the chamber at a location different from a location of the opening or (ii) in a sidewall of the placing table,
the contact member including an annular base portion and a contact portion, the annular base portion being positioned in and connected to the concave portion, with the annular base portion directly physically coupled to the bottom wall inside of the concave portion, the contact portion having a first part connected to the annular base portion and a second part connected to the first part, the second part of the contact portion being configured to be:
in a non-contact, non-conducting state with the shutter while the shutter moves to expose the opening, and
displaced in a direction away from the sidewall inside of the concave portion and different from a moving direction of the shutter to be in a contact, conducting state with the shutter when the shutter is in a position for closing the opening.

2. The plasma processing apparatus of claim 1, wherein the contact portion is a portion of a leaf spring formed of the conductive material, and
the plasma processing apparatus further comprises:
an elastic tube; and
a controller configured to increase a pressure of a fluid filled in the elastic tube so as to expand the elastic tube when the shutter is in the position for closing the opening such that the second part of the contact portion is brought into contact with the shutter by the expanded elastic tube, and wherein when the contact portion is brought into contact with the shutter, the contact portion is directly physically coupled to the shutter.

3. The plasma processing apparatus of claim 2, wherein the chamber has a cylindrical sidewall, and
the shutter has a cylindrical sidewall, and is disposed in the chamber such that a central axis of the shutter overlaps a center axis of the chamber.

4. The plasma processing apparatus of claim 2, wherein the elastic tube is provided between the annular base portion and the contact portion.

5. The plasma processing apparatus of claim 4, wherein the contact portion includes a plurality of sub-contact portions having a gap formed between adjacent two sub-contact portions among the plurality of sub-contact portions, wherein each of the plurality of sub-contact portions is connected to the annular base portion.

6. The plasma processing apparatus of claim 2, wherein the elastic tube is positioned between the annular base portion and the second part of the contact portion such that the elastic tube is in contact with the annular base portion and the second part of the contact portion.

7. The plasma processing apparatus of claim 6, wherein when the controller increases the pressure of the fluid filled in the elastic tube so as to expand the elastic tube, the second part of the contact portion is configured to move towards the shutter and in a direction away from the annular base portion so that the contact portion is directly physically coupled to the shutter.

8. The plasma processing apparatus of claim 1, wherein the chamber has a cylindrical sidewall, and the shutter has a cylindrical sidewall, and is disposed in the chamber such that a central axis of the shutter overlaps a center axis of the chamber.

9. The plasma processing apparatus according to claim 1, wherein the concave portion is formed in the sidewall of the placing table, and the contact member having the annular base portion is positioned in the concave portion so that an annular shape of the annular base portion extends around a portion of the placing table.

10. The plasma processing apparatus according to claim 9, wherein the second part is positioned radially outside of the annular base portion.

11. The plasma processing apparatus according to claim 1, wherein the first part is connected to the annular base portion at a location vertically spaced from a location at which the annular base portion is directly physically affixed to the bottom wall of the concave portion.

12. The plasma processing apparatus according to claim 11, wherein the second part includes an end positioned at a location vertically spaced from a location at which the second part is connected to the first part.

* * * * *